United States Patent
Chavez et al.

(10) Patent No.: US 6,255,860 B1
(45) Date of Patent: Jul. 3, 2001

(54) PULSE DETECTION CIRCUIT, METHOD OF OPERATION THEREOF AND FAN ASSEMBLY TEST CIRCUIT EMPLOYING THE SAME

(75) Inventors: Frank H. Chavez, Dallas; Jin He, Plano; Greg P. Jorgenson, Quinlan, all of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/116,864

(22) Filed: Jul. 16, 1998

(51) Int. Cl.[7] .......................................................... H03K 5/19
(52) U.S. Cl. .............................. 327/20; 327/21; 327/37; 327/74; 340/648
(58) Field of Search .................................. 327/18, 20, 21, 327/31, 37, 72, 74, 77, 50, 26, 7–8; 340/648; 324/542, 772

(56) References Cited

U.S. PATENT DOCUMENTS

| 3,653,018 | * | 3/1972 | Budrys ................................. 340/658 |
| 4,581,544 | * | 4/1986 | Feldman ............................... 327/176 |
| 4,845,379 | * | 7/1989 | Carlsten ................................ 327/20 |

* cited by examiner

*Primary Examiner*—Timothy P. Callahan
*Assistant Examiner*—Minh Nguyen

(57) ABSTRACT

A pulse detection circuit, a method of operation and a fan assembly test circuit employing the same. In one embodiment, the pulse detection circuit includes a charge pump that receives an input signal and varies a charge in a charge storage device based on the input signal. The pulse detection circuit further includes a level detector, coupled to the charge pump, that compares a voltage across the charge storage device with first and second reference voltages, and a signaling circuit, coupled to the level detector, that generates an output signal based on the comparison and indicating an existence of the pulse. The pulse detection circuit may be a part of a fan assembly test circuit adapted to receive an input signal from a cooling fan under test.

23 Claims, 3 Drawing Sheets

PULSE DETECTION CIRCUIT, METHOD OF OPERATION THEREOF AND FAN ASSEMBLY TEST CIRCUIT EMPLOYING THE SAME

TECHNICAL FIELD OF THE INVENTION

The present invention is directed, in general, to power conversion and, more specifically, to a pulse detection circuit, a method of operation thereof and a fan assembly test circuit employing the same.

BACKGROUND OF THE INVENTION

Single or multiple brushless DC cooling fans are widely employed in AC-DC, DC-DC and DC-AC power conversion systems to remove the heat generated by semiconductor switching devices, various magnetic components and other circuit components that are part of the power conversion equipment. Typically, the cooling fan allows the power conversion equipment to be operated at higher temperatures. As a result, the proper operation of the cooling fan plays an important role in overall power system reliability and lifetime.

In most applications, a speed feedback signal from the fan is employed to govern a fan alarm or a system-wide safety interlock. Whenever the speed feedback signal is not detected, the alarm is tripped or the power conversion system is shut down to protect "on-board" circuit components of the power conversion system from excessive heating. In the normal course of assembly and operation, a fan alarm and possible shutdown may be caused by one or all of the following: a broken fan power cable(s), a shorted fan power cable, a loose fan cable connection, an incorrect wiring of the fan power cable, a malfunction of the fan's internal speed sensor, a problem with the fan's power supply and a malfunction of the fan's speed detection circuit.

Generally, after the fan has been assembled into the power conversion system, it becomes difficult (and sometimes impossible) to inspect the fan visually to determine whether it is operating properly or to identify the nature of a malfunction. Alternative, non-visual inspection methods typically require complex inspection/detection circuitry that increase the fan's material and manufacturing costs. The primary reason for the complexity of the inspection/detection circuitry is that the fan speed feedback signal can either be a variable frequency alternating signal, e.g., a 60 Hz to 120 Hz pulse train, or a constant voltage signal, e.g., a 0V or 5V signal.

The form of the fan feedback signal depends on the status of the fan. In the case of a brushless DC fan, the fan feedback signal assumes a constant voltage when the fan is stalled or not running. During normal operation, a pulse train with a peak amplitude of e.g., 5V, is provided at the fan's feedback signal terminal.

The different forms and signal levels that might be encountered results in existing on-board fan detection circuits that are quite cumbersome and complex. Accordingly, what is needed in the art is an improved fan operation detection circuit that overcomes the above-described limitations.

SUMMARY OF THE INVENTION

To address the above-discussed deficiencies of the prior art, the present invention provides a pulse detection circuit, a method of operation and a fan assembly test circuit employing the same. In one embodiment, the pulse detection circuit includes a charge pump that receives an input signal and varies a charge in a charge storage device based on the input signal. A level detector, coupled to the charge pump, makes a comparison among a voltage across the charge storage device and first and second reference voltages. Finally, a signaling circuit, coupled to the level detector, generates an output signal based on the comparison and indicating an existence of the pulse. The pulse detection circuit may be part of an overall fan assembly test circuit that further includes a socket adapted to receive an input signal from a cooling fan under test.

In one embodiment of the present invention, the input signal is a fan speed feedback signal. Under normal operating conditions (fan operating normally), the feedback signal is a variable frequency alternating signal. It should also be noted that the present invention is not limited to determining the operational status of a fan and may also be advantageously employed where detection of a variable frequency alternating signal is required.

In one embodiment of the present invention, the signaling circuit further includes a current indicator that indicates a state of the level detector. In yet another embodiment, the current indicator is a light emitting diode (LED). Alternatively, audible devices, such as buzzers, may also be advantageously employed. Those skilled in the art should readily appreciate that any device capable of detecting current flow and generating a signal in response thereto is well within the broad scope of the present invention.

In one embodiment of the present invention, the level detector includes first and second operational amplifiers (op-amps) configured as open-collector comparators. In an embodiment to be illustrated and described, the first and second reference voltages, which are derived from taps of a voltage divider network, are coupled to the inverting nodes of the second comparator and the non-inverting node of the first comparator, respectively.

In one embodiment of the present invention, the charge storage device is a capacitor. However, it should also be readily apparent to those skilled in the art that the charge storage device is not only limited to capacitors, other energy storage devices may also be advantageously employed and are within the broad scope of the present invention.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the concepts and the specific embodiments disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
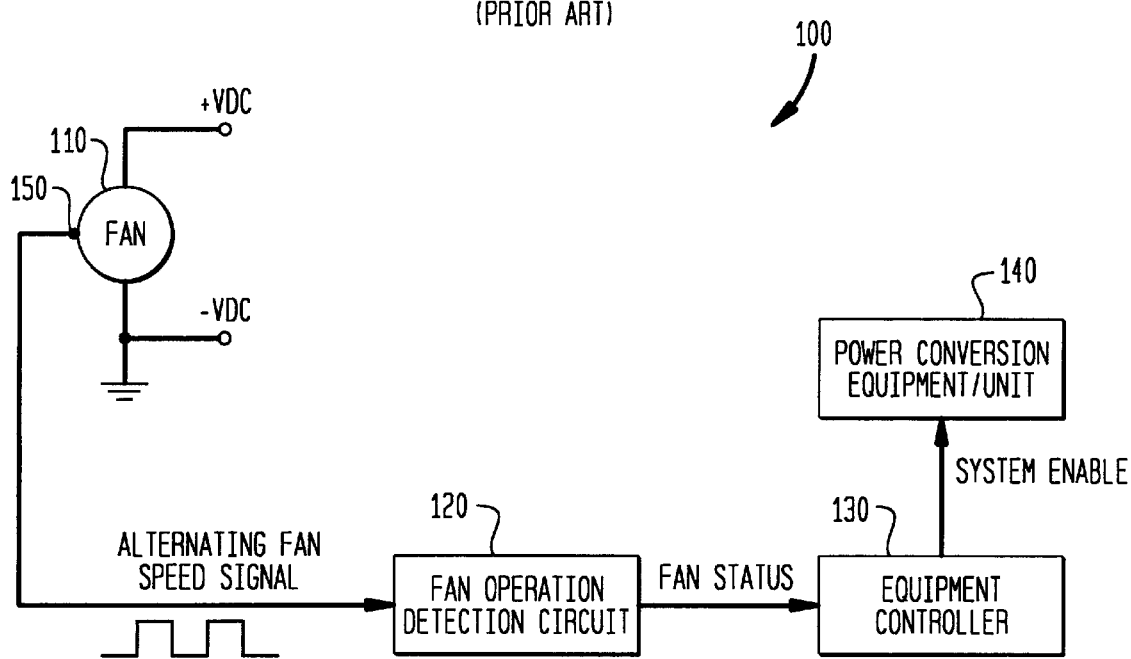
FIG. 1 illustrates a block diagram of a conventional fan operation detection scheme that provides a suitable environment for the practice of the present invention.

Referring initially to FIG. 1, illustrated is a block diagram of a conventional fan operation detection scheme 100 that provides a suitable environment for the practice of the present invention. In the illustrated embodiment, a brushless DC cooling fan 110 is powered by a DC voltage source VDC and generates a feedback signal, e.g., pulse train, to a fan operation detection circuit 120. The detection circuit 120 "interprets" the feedback signal and, in turn, generates a fan status signal to an equipment controller 130. In a typical system, the equipment controller 130, which generally functions as a main system controller, enables a power conversion equipment/unit 140 only after the fan status signal indicates that the fan 110 is functioning normally.

As discussed previously, the form of the fan feedback signal depends on the status of the fan 110. In the case of the brushless DC fan 110, the fan feedback signal is at a constant voltage, e.g., at 0V or 5V, when the fan is stalled or not running. During normal operation, a pulse train with a peak amplitude, e.g., of 5V, is provided at the fan 110 feedback signal terminal 150. The feedback signal's different forms and signal levels, corresponding to the different operational status of the fan 110, result in the fan operation detection circuit 120 being quite cumbersome and complex.

Figure 2:
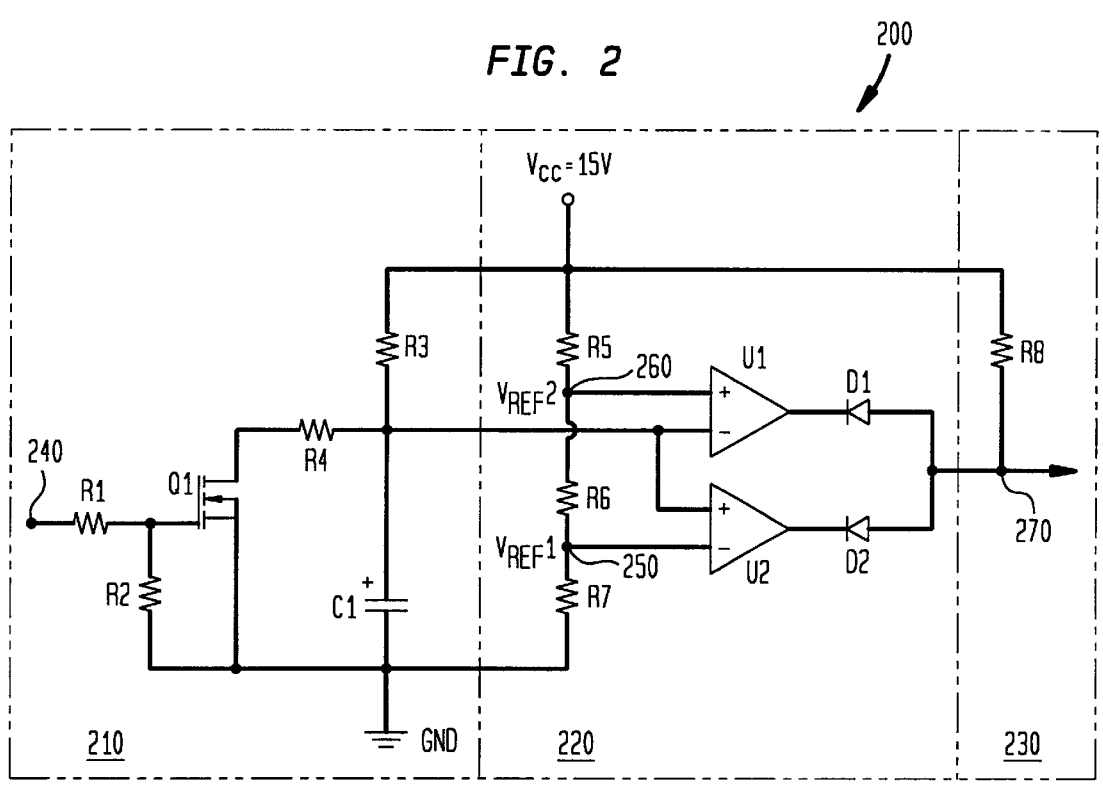
FIG. 2 illustrates a schematic diagram of an embodiment of a pulse detection circuit according to the principles of the present invention.

Turning now to FIG. 2, illustrated is a schematic diagram of an embodiment of a pulse detection circuit 200 according to the principles of the present invention. The pulse detection circuit 200, which may be advantageously employed as the fan operation detection circuit 120 (illustrated in FIG. 1), includes a charge pump 210, level detector 220 and a signaling circuit 230. The charge pump 210 includes first and second resistors R1, R2 coupled to a gate of a transistor Q1, a NPN field-effect-transistor (FET) is shown. The charge pump 210 also includes a charge storage device (capacitor C1) that is coupled to third and fourth resistors R3, R4. Although a capacitor is shown in the illustrated embodiment, those skilled in the art should readily appreciate that other charge storage devices may also be advantageously employed.

The level detector 220 includes a voltage divider network comprising fifth, sixth and seventh resistors R5, R6, R7. First and second reference voltages Vref1, Vref2 are derived from first and second taps 250, 260 located between the sixth and seventh resistors R6, R7 and between the fifth and sixth resistors R5, R6, respectively. The first reference voltage Vref1 is provided to the inverting node of a second comparator U2 and the second reference voltage Vref2 is provided to the non-inverting node of a first comparator U1. The level detector further includes diodes D1, D2 that are coupled to the first and second op-amps U1, U2 configured as open-collector comparators.

The signaling circuit 230 includes an eight resistor R8 and an output terminal 270 that are coupled to the anode terminals of the first and second diodes D1, D2. The operation of the pulse detection circuit 200 will hereinafter be described in greater detail as part of the fan operation detection scheme 100 illustrated in FIG. 1. It should be noted, however, that the practice of the present invention is not limited to determining the operational status of a fan and may also be advantageously employed where detection of a variable frequency alternating signal is required. In the following discussion, under normal operating conditions, i.e., fan operating properly, the fan speed feedback signal is assumed to be a pulse train with 5V peak amplitude. When a failure has occurred, the fan speed feedback signal is a constant voltage of 0V or 5V. Furthermore, the operation of the pulse detection circuit 200 will be described under three conditions: (1) normal fan operation, (2) fan inoperative with 0V output and (3) fan inoperative with 5V output.

(1) Normal fan operation. When the fan is running and its internal speed sensor (not shown) is functioning properly, the charge pump 210 receives a series of 50% duty cycle 0V to +5V pulse train at an input terminal 240. The values of the first and second resistors R1, R2 are chosen so that the transistor Q1 is turned off when the fan feedback signal received at the input terminal 240 is at 0V. This allows the capacitor C1 to be charged up via the third resistor R3. The transistor Q1 is turned on when the input signal at the input terminal 240 is at +5V to discharge the capacitor C1 via the fourth resistor R4. The values of the third and fourth resistors R3, R4 are chosen so that the voltage across the capacitor C1 is built up to a value, Vc1.

The voltage divider circuit consisting of the fifth, sixth and seventh resistors R5, R6, R7 sets two reference levels Vref1 and Vref2, where Vref2>Vref1. The voltage across the capacitor C1, i.e., Vc1, is set to satisfy the following condition (at normal fan operating condition), 0V<Vref1<Vc1<Vref2<Vcc (+15V). Consequently, the outputs of the first and second comparators U1, U2 are at a high logic state. In the case where the pulse detection circuit 200 is used as an on-board detection circuit, a high logic level "OK" signal is sent via the output terminal 270 to a main controller, e.g., equipment controller 130 illustrated in FIG. 1, which allows a system, e.g., power conversion unit 140 illustrated in FIG. 1, to be operated as required.

(2) Fan inoperative with 0V output. When the fan is not running and the speed feedback signal is at 0V, the transistor Q1 within the charge pump 210 is turned off. As a result, the capacitor C1 is fully charged to Vcc, i.e., Vc1=Vcc>Vref2. Therefore, the output of the first comparator U1 is at a low state, i.e., logic low. Consequently, the first "Oring" diode D1 is turned on (forward biased) and a fan alarm signal is sent via the output terminal 270 to the main controller to shutdown the system if necessary.

(3) Fan inoperative with 5V output. When the fan is not running and the speed feedback signal received at the input terminal 240 is at +5V, the transistor Q1 within the charge pump 210 is turned on. As a result, the capacitor C1 is fully discharged to 0V, i.e., Vc1=0V<Vref1. Consequently, the output of the second comparator U2 is at a low state. Therefore, the second "Oring" diode D2 is turned on (forward biased) and a fan alarm signal is also sent to the main controller to shutdown the system if necessary.

Figure 3:
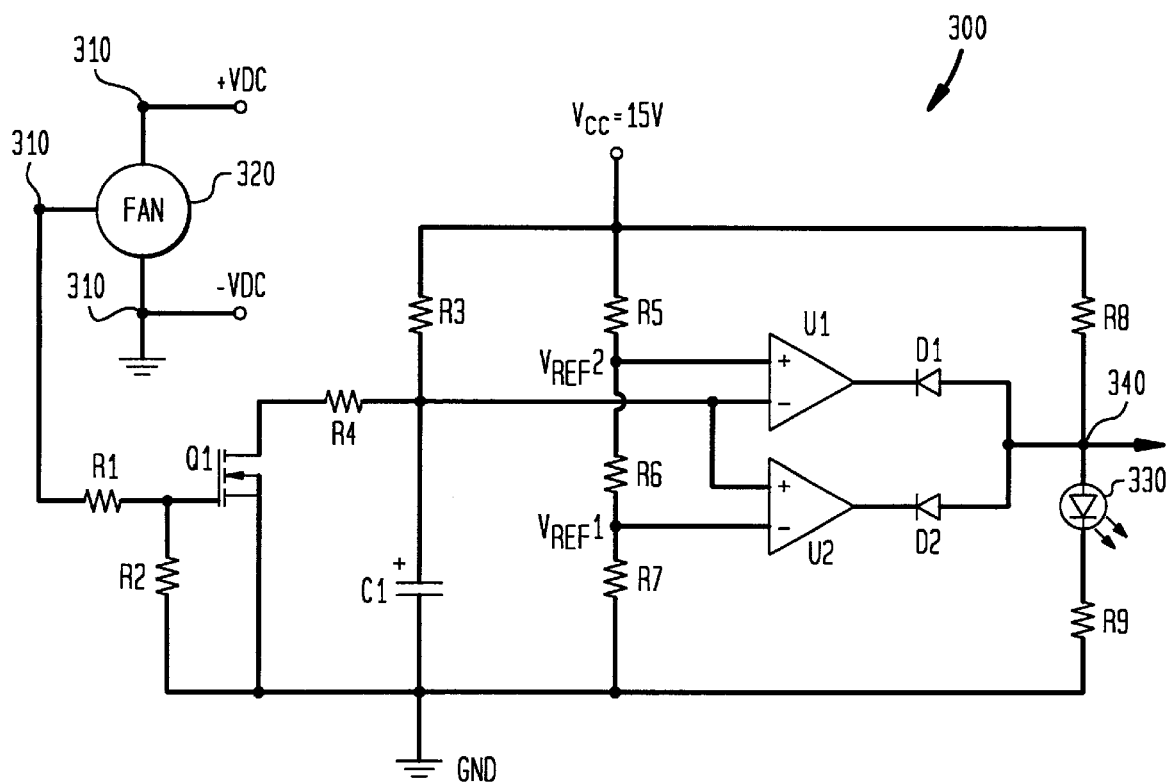
FIG. 3 illustrates a schematic diagram of an embodiment of a fan assembly test circuit according to the principles of the present invention.

Turning now to FIG. 3, illustrated is a schematic diagram of an embodiment of a fan assembly test circuit 300 according to the principles of the present invention. The fan assembly test circuit 300 is analogous to the pulse detection circuit 200 illustrated in FIG. 2, except for a plurality of sockets (generally designated 310), which have been adapted to power a fan under test and to receive a fan speed feedback signal from a fan assembly 320, and a current indicating device (a light emitting diode is shown) 330 series-coupled to a current-limiting ninth resistor R9. The type of device used for sockets 310 is dependent on the fan assembly 320 fan feedback signal and power connections and may include conventional test leads or a mating connector if the terminals that provide the feedback signal and power connections are embodied in a connector. In another advantageous embodiment, the current indicating device 330 is an audible warning device such as a buzzer.

The operation of the fan assembly test circuit 300 is similar to that of the pulse detection circuit 200 (illustrated in FIG. 2) discussed previously. In the case where the fan assembly 320 is functioning normally, i.e., generating a pulse train at the socket 310, the resulting logic high signal at an output terminal 340 reverse biases first and second "Oring" diodes D1, D2. Concurrently, the LED 330 is forward biased and indicates a current flow. The resulting LED 330 signal indicates that the fan assembly 320 including the speed sensor, cables and connectors are functioning properly.

On the other hand, if the fan assembly 320 is inoperative and a constant signal of 0V or 5V is received at the socket 310, the first diode D1 (for 0V) or the second diode D2 (for 5V) becomes forward biased. In either case, the LED 330 is turned off due to low terminal voltage, indicating a problem or failure in the fan assembly 320.

From the foregoing, it is apparent that the present invention provides a novel pulse detection circuit that can be used for fan alarm generation in a power conversion system and for a system safety interlock that prevents the power system from being operated when heat is excessive. Furthermore, with an addition of a visual warning (LED) and/or audible warning (buzzer) device, the disclosed circuit may be used in the manufacturing/assembly process to provide a test circuit to verify that the fan assembly of the power conversion unit is functioning properly.

Although the present invention and its advantages have been described in detail, those skilled in the art should understand that they can make various changes, substitutions and alterations herein without departing from the spirit and scope of the invention in its broadest form.

What is claimed is:

1. A pulse detection circuit, comprising:
   a charge pump that receives an input signal and varies a charge in a charge storage device based on said input signal;
   a level detector, coupled to said charge pump and including a comparator circuit and at least one Oring diode coupled to an output thereof, that makes a comparison among a voltage across said charge storage device and first and second reference voltages and generates a substantially constant signal as a function thereof, said signal being a first level when said input signal is a pulse train and said signal being a second level when said input signal is substantially constant; and
   a signaling circuit, coupled to said level detector, that provides said substantially constant signal based on said comparison.

2. The pulse detection circuit as recited in claim 1 wherein said input signal is a variable frequency alternating signal.

3. The pulse detection circuit as recited in claim 1 wherein said signaling circuit further comprises a current indicator that indicates a state of said level detector.

4. The pulse detection circuit as recited in claim 3 wherein said current indicator is a light emitting diode (LED).

5. The pulse detection circuit as recited in claim 1 wherein said comparator circuit includes first and second operational amplifiers (op-amps) configured as open-collector comparators.

6. The pulse detection circuit as recited in claim 1 wherein said first and second reference voltages are derived from taps of a voltage divider network.

7. The pulse detection circuit as recited in claim 1 wherein said charge storage device is a capacitor.

8. The pulse detection circuit as recited in claim 1 wherein said charge pump further comprises a switch.

9. A method of detecting a pulse train, comprising:
   varying a charge in a charge storage device based on an input signal;
   comparing a voltage across said charge storage device with first and second reference voltages and generating a substantially constant signal based on said comparing with a level detector including a comparator circuit and at least one Oring diode coupled to an output thereof, said signal being a first level when said input signal is said pulse train and said signal being a second level when said input signal is substantially constant; and
   providing said substantially constant signal therefrom.

10. The method as recited in claim 9 wherein said input signal is a variable frequency alternating signal.

11. The method as recited in claim 9 wherein said generating an output signal further includes using a current indicator that indicates a state of said level detector.

12. The method as recited in claim 11 wherein said current indicator is a light emitting diode (LED).

13. The method as recited in claim 9 wherein said comparator circuit includes first and second operational amplifiers (op-amps) configured as open-collector comparators.

14. The method as recited in claim 9 wherein said first and second reference voltages are derived from taps of a voltage divider network.

15. The method as recited in claim 9 wherein said charge storage device is a capacitor.

16. The method as recited in claim 9 wherein said varying further comprises operating a switch to vary said charge of said storage device.

17. A fan assembly test circuit, comprising:
   a socket adapted to receive an input signal from a cooling fan under test;
   a pulse detection circuit, coupled to said socket, including:
      a charge pump that receives an input signal and varies a charge in a charge storage device based on said input signal,
      a level detector, coupled to said charge pump and including a comparator circuit and at least one Oring diode coupled to an output thereof, that makes a comparison among a voltage across said charge storage device and first and second reference voltages and generates a substantially constant signal as a function thereof, said signal being a first level when said input signal is a pulse train and said signal being a second level when said input signal is substantially constant; and
      a signaling circuit, coupled to said level detector, that provides said substantially constant signal based on said comparison, thereby determining an operational status of said cooling fan.

18. The fan assembly test circuit as recited in claim 17 wherein said signaling circuit further comprises a current indicator that indicates a state of said level detector.

19. The fan assembly test circuit as recited in claim 18 wherein said current indicator is a light emitting diode (LED).

20. The fan assembly test circuit as recited in claim 17 wherein said charge storage device is a capacitor.

21. The fan assembly test circuit as recited in claim 17 wherein said input signal is a variable frequency alternating signal.

22. The fan assembly test circuit as recited in claim 17 wherein said first and second reference voltages are derived from taps of a voltage divider network.

23. The fan assembly test circuit as recited in claim 17 wherein said charge pump further comprises a switch.

* * * * *